United States Patent [19]

Evans, Jr.

[11] 4,082,569
[45] Apr. 4, 1978

[54] SOLAR CELL COLLECTOR

[75] Inventor: John C. Evans, Jr., North Olmsted, Ohio

[73] Assignee: The United States of America as represented by the Administrator of the National Aeronautics and Space Administration, Washington, D.C.

[21] Appl. No.: 770,869

[22] Filed: Feb. 22, 1977

[51] Int. Cl.² .................. H01L 31/04; H01L 31/06
[52] U.S. Cl. .................... 136/89 CC; 357/30; 357/65; 357/67; 29/572; 427/75; 427/261
[58] Field of Search ............ 136/89 CC; 250/211 R, 250/211 J, 212; 357/30, 65, 67

[56] References Cited

U.S. PATENT DOCUMENTS

| 2,310,365 | 2/1943 | Hansell | 136/89 |
| 2,320,185 | 5/1943 | Lamb | 136/89 |
| 2,677,715 | 5/1954 | Auwärter | 136/89 |
| 3,778,684 | 12/1973 | Fischer et al. | 317/234 R |
| 3,880,633 | 4/1975 | Jordan et al. | 65/60 |
| 3,888,697 | 6/1975 | Bogus et al. | 136/89 |
| 3,982,964 | 9/1976 | Lindmayer et al. | 136/89 |
| 3,990,914 | 11/1976 | Weinstein et al. | 136/89 |
| 4,029,518 | 6/1977 | Matsutani et al. | 136/89 |

Primary Examiner—Aaron Weisstuch
Attorney, Agent, or Firm—N. T. Musial; J. R. Manning; G. E. Shook

[57] ABSTRACT

A transparent, conductive collector layer containing conductive metal channels is formed as a layer on a photovoltaic substrate by coating a photovoltaic substrate with a conductive mixed metal layer; attaching a heat sink having portions protruding from one of its surfaces which define a continuous pattern in combination with recessed regions among said protruding portions to said substrate such that said protruding portions of said heat sink are in contact with the conductive layer of said substrate; and heating said substrate while simultaneously oxidizing the portions of the conductive layer exposed to a gaseous oxidizing substance forced into said recessed regions of said heat sink, thereby creating a transparent metal oxide layer on said substrate containing a continuous pattern of highly conductive metal channels in said layer.

8 Claims, 2 Drawing Figures

HEAT

SOLAR CELL COLLECTOR

ORIGIN OF THE INVENTION

The invention described herein was made by an employee of the United States Government and may be manufactured or used by or for the Government without the payment of any royalties thereon or therefor.

BACKGROUND OF THE INVENTION

1. Field of the Invention

The present invention relates to a method of fabricating photovoltaic solar cells equipped with surface collector grids. More particularly, the invention relates to a method of coating the surface of a silicon substrate with a metal collector grid in a manner which obscures only a minimum of the surface while at the same time providing good conduction of carriers to the external circuitry of the silicon solar cell.

2. Description of the Prior Art

In the past, photovoltaic devices such as solar cells have been prepared by depositing collector grids on the surface of the photovoltaic substrate of the cell by vacuum evaporation or sputtering of a metal or conductive substance. The deposition step is frequently followed by a step in which the substrate is further plated with a conductor to further increase the current conducting capacity of the collector system. No matter how the collector system is fabricated, the function of the collector is to provide nearby available conductors for the carriers which are generated by the absorption of photons of light in the semiconductor substrate. In the past, the impurity concentration or doping level of the wafer from which a photovoltaic silicon solar cell is fabricated, has been substantially limited to a level such as about ten ohm-centimeter resistivity. If the level of doping is increased such that a lower resistivity material is formed, the conversion efficiency of the device is reduced because or recombination losses of electrons which are unable to reach the widely-spaced collector grid wires. One method of overcoming this problem has been to provide a grid collector system containing more numerous collectors which are more closely spaced. However, it would be more desirable to be able to employ solar cells which are more heavily doped such that they possess a resistivity on the order of 1.0 or 0.1 ohm-cm. A type of collector system which would be ideal is a grid-like surface collector which would obscure a minimum area of the surface of the substrate exposed to light while providing a low-resistance current path for the carriers. The lifetime characteristics of the carriers is an important property to consider in the perparation of a collector system so that the carriers will be able to reach the collector wires of the system and flow through the external circuitry of the photovoltaic system to perform work. One of the most significant deficiencies of the prior art collector systems is that many of the carriers are lost before they can be collected, even in the best of the current collector designs. Collector systems are generally designed with the main conductor or channels being of relatively large current conducting capacity with many more smaller current conductors attached to the main conductive channels.

Methods are known in the art for providing photovoltaic substrates with a transparent or at least translucent layer which functions as one of the electrodes necessary for the passage of the current generated by incident photons on the device. Thus, U.S. Pat. No. 3,811,953 shows a photovoltaic device coated with a conductive, transparent layer of $Cd_2SnO_4$ which functions as a conductive electrode. U.S. Pat. No. 2,766,144 shows a photovoltaic device coated with a translucent coating of a Group III element such as indium or Group V elements such as antimony as a conductive electrode. U.S. Pat. No. 2,870,338 shows a transparent conductive layer of a material such as tin oxide on a photovoltaic substrate. However, these devices have the disadvantage that such transparent, conductive surfaces as $Cd_2SnO_4$ and $SnO_2$ lack highly conductive channels within or on the conductive layer which adversely affects the ability of the device to effectively transport the current generated by the incident photons to the external circuitry of the device. Moreover, photovoltaic substrates which are coated with a layer of a Group III or V element have the disadvantage that the current generating ability of the device is diminished because of the reduced transparency of the layer.

The present invention meets the need for an improved collector system for photovoltaic devices in that it has the advantages of the high conductivity of a metallic mesh, it is designed to obscure only a minimum area of the surface of the photovoltaic device exposed to light with opaque material while providing good conductivity for the carriers generated by light photons to th external circuitry of the device and it maintains the advantage provided by a transparent electrically conductive coating in contact with the total active diffused surface of the photovoltaic substrate.

SUMMARY OF THE INVENTION

Accordingly, one object of the present invention is to provide a method of fabricating a photovoltaic device which possesses an efficient collector system for the conduction of the current generated by incident photons to the external circuitry of the device.

Another object of the present invention is to provide a photovoltaic device which possesses a collector system having the advantage of the conductive properties of metal while at the same time allowing only a minimum area of the surface of the device to be obscured.

Briefly, these objects and other objects of the present invention as hereinafter will become more readily apparent can be attained by a method for establishing a transparent current collector on the surface of a solar cell by coating a photovoltaic substrate with a conductive mixed metal layer, attaching a heat sink having portions protruding from one of its surfaces which define a continuous pattern in combination with recessed regions among said protruding portions to said substrate such that said protruding portions of said heat sink are in contact with the conductive layer of said substrate; and heating said substrate while simultaneously oxidizing the portions of the conductive layer exposed to a gaseous oxidizing substance forced into said recessed regions of said heat sink, thereby creating a transparent metal oxide layer on said substrate containing a continuous pattern of highly conductive metal channels in said layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

The present invention is concerned with an improved collector system which can be applied to the surfaces of known photovoltaic devices. The collector system provides an electrically conductive, protective transparent coating for the underlying photovoltaic substrate and at the same time provides for a very effective metallic grid system which conducts the current generated by incident photons to the external circuitry of the device. In the devices prepared by the present process, the electrons released by the photovoltaic process need only traverse the relatively short distance between the site in the lattice wherein a photon is absorbed and the electron freed from an atom to the surface collector sheet. Once the electron has reached either the transparent mixed metal oxide layer or a metallic conductor, it is available to do work. Most recombination losses are avoided by this technique. The collector system utilizes oxidized metal combinations of indium-tin or indium-arsenic which have been used in the past along with various other materials as transparent, conductive coatings for windshields, hot plates and the like. A particularly prominent use of the transparent oxide coating has been for the heating of aircraft cockpit canopies and wind screens to prevent icing and fogging. The mixed metal oxide coatings have also been used as a protective, electrically conductive, transparent layer for thin films of cadmium sulfide.

Figure 1:
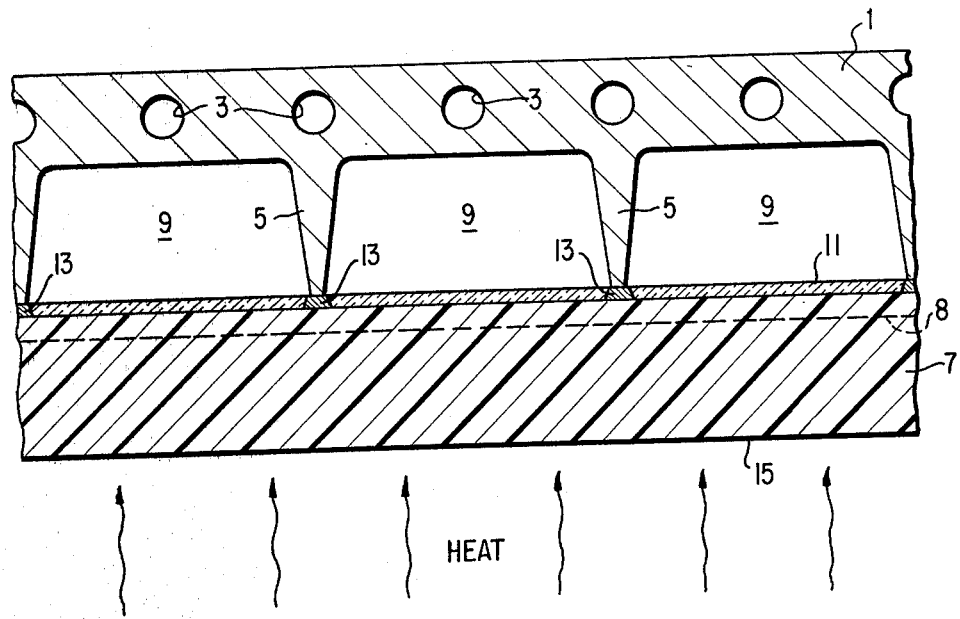
FIG. 1 shows a heat sink device used in combination with a photovoltaic substrate to form a transparent collector layer on the substrate containing highly conductive metal channels.

The method of the present invention of fashioning a transparent electrically conductive coating for photovoltaic substrates having metallic conductive channels therein can be more clearly understood by reference to FIG. 1. A heat sink 1 or heat conductor is fashioned from a block of a metal such as copper, silver, gold, or platinum. The block 1 is provided with channels 3 for the flow of a coolant such as water through the heat sink, and is further characterized by raised portions 5 which protrude from the block 1 in such a fashion so as to define the pattern of the metallic grid system desired for the collector system coated on photovoltaic substrate 7. The heat sink is of a size sufficient to define a grid system pattern on a photovoltaic substrate. Solar cells differ in sizes according to use and shape. Typical sizes of rectangular shaped devices are 1 cm X 2 cm and 2 cm X 4 cm, while a typical square shaped device is 2 cm X 2 cm. Circular shaped devices typically are of 2 inch, 3 inch and 4 inch nominal sizes. Even larger photovoltaic devices will be soon used for terrestial use. Moreover, collector patterns employed currently on commercial solar cells vary greatly. For example, a space quality 2 cm$^2$ cell may have eight uniformly-spaced parallel wires joined to a heavier bar running at right angles to the parallel wires along an edge of the cell. The silicon cells commonly used in satellites placed in orbit by COMSAT (Communications Satellite Corp.) of the same size may have 60 fine wires to form the collector system described above. A 3 inch diameter terrestial wafer may have a dendritic or chevron configured collector. No matter what the size and shape of the individual cell, the surface area of the cell obscured by the collector grid system ranges from about 5% to 10% of the total photovoltaically active surface. In the present invention however, the obscured area is reduced to only about 3% to 5% while at the same time the collection efficiency of the cell is increased as a result of reduced recombination losses. Protruding portions 5 of the block 1 also define the pattern of recessed regions 9 of the block.

A photovoltaic substrate or solar cell such as a film of cadmium sulfide or a silicon substrate whose surface has been diffused with a counter dopant in a conventional manner is coated with a conductive layer 11 of indium-tin, indium-antimony or indium-arsenic by any conventional technique such as vacuum evaporation or vacuum sputtering to a thickness such that the thickness of the mixed metal oxide conductive layer formed ranges from 500A to 10 $\mu$ m. Thicker perimeter conductors may be added by known methods such as solder dipping, plating, and the like. A factor in determining the thickness of the layer 11 is that it must be thick enough so that the total collector grid system has sufficient conductivity. Other suitable photovoltaic substrates to which the collector grid system of the present invention can be applied include gallium arsenide and numerous other types of solar cells. Other suitable substrates include Schottky barrier and heterojunction devices. The $p$ and $n$ dopants used in the surface layers of these devices must be accounted for in the design and doping of the transparent conductive grid system. However, it has been established that properly formed transparent conductive layers are compatible with both conductivity types. Line 8 defines a surface diffused region or junction region if the photovoltaic substrate employed is an $n/p$ or $p/n$ photovoltaic diode or solar cell.

The block 1 is positioned and secured against the solar cell 7 such that the protruding portions 5 of the block 1 are in contact with the conductive layer 11 of the solar cell. The solar cell 7 is then subjected to heat on the bottom side 15 of the cell. The cell can be heated simply by placing the substrate in open air on a hot plate or heating block controlled by a thermocouple. Also, a flow of hot air from any suitable device can be used. However, the use of an electrically heated block probably provides better heat control. At the same time a gaseous oxidant such as moist air or oxygen is forcefully passed through or allowed into the recessed regions 9 of the block 1 which causes the oxidation of all portions of the conductive layer 11 exposed to the oxidizing atmosphere to a transparent, mixed metal oxide layer. The heat sink 1 is positioned on the mixed metal layer 11 of the solar cell substrate such that protruding portions 5 are in contact with the metal layer 11. In the design of heat sink 1, it is only necessary that recessed regions 9 be of sufficient relief or clearance above layer 11 to allow the free flow of oxidizing gas molecules in the regions as they strike and rebound from the surface and combine with the metal elements in the layer. The gas molecules will have rather large mean free paths which are dictated by the temperature of the substrate, the extent of access to more of an atmosphere and the ambient pressure of the gas used. The depth of the recessed regions 9 can be determined empirically. Furthermore, the relative closeness of the conductive metal channels 13 in the oxide layer 11 will determine the spacings between protruding portions 5. These factors are not likely to be critical over a great range. For example, for the honeycomb pattern shown in FIG. 2 and if a three inch diameter solar cell is assumed, a clearance of about 2 millimeters of the recessed regions 9 above the oxide layer 11 will be sufficient. If other types of collector grid patterns are used, the clearance will decrease or increase according to the desired grid geometry. Alternatively, in some cases such as the case of the honeycomb pattern shown in FIG. 2, it may be desirable to provide the heat sink 1 with small diameter holes such as about 1 millimeter centered in each of the hexagonal shaped recessed regions 9 of the heat sink 1 for the free movement of the gases of the oxidizing atmosphere. Moreover, if the recessed regions 9 are sufficiently deep in the heat sink, enough oxygen may be present in these regions such that it will not be necessary to pass additional oxidizing gas into the recessed regions 9 to complete the oxidation process. Alternatively, the oxidation of the layer 11 may very well be accelerated by forced circulation of an atmosphere through the heat sink. It is important that the heat sink be able to effectively conduct heat away from layer 11 wherever the layer is in contact with the heat sink so that the temperature in layer 11 under protruding portions 5 never reaches the oxidation temperature of the metal alloy. The areas 13 of the conductive layer 11 under the protruding portions 5 which are protected from the oxidizing atmosphere remain unoxidized and thus define a pattern of highly conductive metal channels through conductive layer 11. Heat is also conducted from areas 13 by the protruding portions 5 to the coolant flowing through the block. The temperature at which the oxide layer normally forms is dependant upon several variables which include alloy constitution of the metal films, the thickness of the metal film, and the like. Thus, for the alloy systems used for the formation of the transparent metal oxide layer, any ratio of one element to the other element can be used because an oxidation temperature within the range of 400° C to 700° C is sufficient to cause complete oxidation of the metal layer. Complete oxidation normally occurs in a brief time, for instance, on the order of 10 minutes. An empirical determination of the conditions necessary for the oxidation of the metal surface may simply be conducted by heating a coated substrate in air and measuring the parameters to achieve a transparent mixed metal oxide layer. For example, a silicon wafer 10 – 12 mils (300 $\mu$ m) thick can be surface oxidized in about 10 minutes. The oxidizing atmosphere may be ambient air which is circulated by convection or is forced through the heat sink. Other oxidizing atmospheres can be obtained by enriching air with oxygen or by mixing oxygen with an inert gas in any amount sufficient to accomplish the desired oxidation. Also water vapor can be present in the oxidizing atmosphere up to the level of 60% humidity and even greater to increase the rate of oxidation. None of the conditions of the oxidizing gas are critical and it is only important that the temperature of oxidation be sufficient to completely oxidize the desired portions of layer 11 in the collector sheet while the metallic nature of the embedded grid structure is maintained. The protruding portions 5 of the block 1 also prevent oxidation of the underlying areas 13 by acting as a heat sink, thereby dissipating heat from regions 13. In an alternative method of accomplishing the oxidation of the conductive layer 11, hot moist air can be forced through the recessed regions 9 to oxidize the exposed portions of the conductive layer while the portions 5 of the heat sink conduct heat away from areas 13 and prevent contact of the layer 11 with hot moist air.

Figure 2:
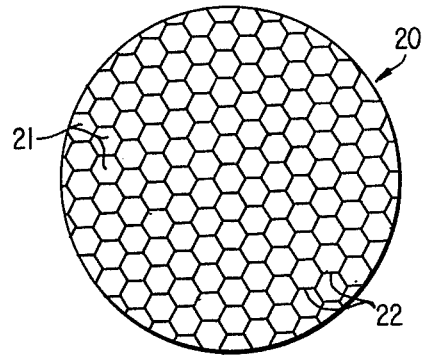
FIG. 2 shows an example of a transparent collector layer containing a honeycomb pattern of conductive metal channels on a photovoltaic substrate.

FIG. 2 shows an embodiment of the photovoltaic device of the present invention wherein a solar cell 20 is coated with a transparent collector layer consisting of transparent mixed metal oxide windows 21 which in combination with highly conductive metallic channels 22 define a honeycomb shape of the metal channels within the collector layer.

Having now fully described the invention, it will be apparent to one of ordinary skill in the art that many changes and modifications can be made thereto without departing from the spirit or scope of the invention as set forth herein.

What is claimed as new and intended to be covered by Letters Patent is:

1. A photovoltaic device having a transparent collector layer thereon, which comprises:
   a photovoltaic substrate coated with a transparent, conductive mixed metal oxide collector layer containing a continuous pattern of higher conductivity metal channels therein, the metallic elements of said mixed metal oxide collector layer being the same as the metallic elements of said conductive channels.

2. The device of claim 1, wherein said mixed metal oxide collector layer is 500A to 10 $\mu$ m thick.

3. The device of claim 1, wherein said photovoltaic substrate is a film of gallium arsenide or cadmium sulfide, a heterojunction device, a Schottky barrier device or an *n/p* or *p/n* photovoltaic diode.

4. The device of claim 1, wherein said continuous pattern of higher conductivity metal channels is of a honeycomb pattern in the conductive mixed metal oxide layer.

5. A photovoltaic device having a transparent collector layer thereon comprising,
   a photovoltaic substrate,
   a transparent, conductive mixed metal oxide collector layer on said substrate, and
   a plurality of higher conductivity metal channels contained in said collector layer, the metallic elements in said collector layer and conductive channels comprising mixtures of indium and tin, indium and arsenic, and indium and antemony.

6. The device of claim 5, wherein the thickness of said mixed metal oxide collector layer ranges from 500A to 10 $\mu$ m.

7. The device of claim 5, wherein said photovoltaic substrate is a film of gallium arsenide or cadmium sulfide, a heterojunction device, a Schottky barrier device or an *n/p* or *p/n* photovoltaic diode.

8. The device of claim 5, wherein the higher conductivity metal channels form a continuous honeycomb pattern.